United States Patent
Yeh et al.

(10) Patent No.: US 9,570,712 B2
(45) Date of Patent: Feb. 14, 2017

(54) ORGANIC LIGHT-EMITTING MODULE

(71) Applicant: Industrial Technology Research Institute, Hsinchu (TW)

(72) Inventors: Wen-Yung Yeh, Hsinchu County (TW); Hsi-Hsuan Yen, Taipei (TW); Chen-Kun Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/447,626

(22) Filed: Jul. 31, 2014

(65) Prior Publication Data

US 2016/0036006 A1    Feb. 4, 2016

(51) Int. Cl.
    *H01L 51/52*     (2006.01)
    *H01L 51/00*     (2006.01)

(52) U.S. Cl.
    CPC ....... *H01L 51/5275* (2013.01); *H01L 51/0096* (2013.01)

(58) Field of Classification Search
    None
    See application file for complete search history.

(56) References Cited

U.S. PATENT DOCUMENTS

| 6,933,537 B2 | 8/2005 | Yee et al. |
| 7,316,756 B2 | 1/2008 | Boroson |
| 8,692,446 B2 | 4/2014 | Zhang et al. |
| 8,835,959 B2 * | 9/2014 | Nakamura ............... H01L 33/22 257/103 |
| 2005/0184377 A1* | 8/2005 | Takeuchi ............ H01L 21/6835 257/686 |
| 2007/0200496 A1 | 8/2007 | Cok et al. |

(Continued)

FOREIGN PATENT DOCUMENTS

| JP | 2004004777 | 1/2004 |
| JP | WO 2011/030789 | * 3/2011 |

(Continued)

OTHER PUBLICATIONS

Yiru Sun, et al., "Organic light emitting devices with enhanced outcoupling via microlenses fabricated by imprint lithography," Journal of Applied Physics, vol. 100, 2006, pp. 073106-1-pp. 073106-6.

(Continued)

*Primary Examiner* — Ali Naraghi
(74) *Attorney, Agent, or Firm* — Jianq Chyun IP Office (57) ABSTRACT

An organic light-emitting module including a light-transmissive substrate, a light extracting structure, a first electrode, an organic light-emitting stack, a second electrode, and a transparent carrying board is provided. The light-transmissive substrate has an index of refraction greater than 1.5 and has a first surface and a second surface opposite to the first surface. The light extracting structure is disposed at the first surface. The first electrode is disposed on the second surface of the light-transmissive substrate. The organic light-emitting stack is disposed on the first electrode. The second electrode is disposed on the organic light-emitting stack. The transparent carrying board is connected with the light extracting structure. A minimum distance between the light extracting structure and the transparent carrying board is less than or equal to 125 μm.

22 Claims, 8 Drawing Sheets

(56) References Cited

U.S. PATENT DOCUMENTS

| | | | |
|---|---|---|---|
| 2007/0205520 A1* | 9/2007 | Chou | H01L 23/3157 257/780 |
| 2012/0205702 A1 | 8/2012 | Aoyama et al. | |
| 2013/0062654 A1 | 3/2013 | Taima et al. | |
| 2015/0104892 A1* | 4/2015 | Takezoe | B29D 11/00365 438/29 |

FOREIGN PATENT DOCUMENTS

| | | |
|---|---|---|
| JP | 2011-204364 | 10/2011 |
| TW | 201214819 | 4/2012 |
| TW | 201242414 | 10/2012 |

OTHER PUBLICATIONS

Won Hoe Koo, et al., "Light extraction from organic light-emitting diodes enhanced by spontaneously formed buckles," Nature Photonics, vol. 4, Apr. 2010, pp. 222-pp. 226.

Kihyon Hong, et al., "Review Paper: Recent Developments in Light Extraction Technologies of Organic Light Emitting Diodes," Electronic Materials Letters, vol. 7, No. 2, Jun. 2011, pp. 77-pp. 91.

H. J. Peng, et al., "Enhanced coupling of light from organic light emitting diodes using nanoporous films," Journal of Applied Physics vol. 96, No. 3, Aug. 2004, pp. 1649-pp. 1654.

Won Hoe Koo, et al., "Light Extraction of Organic Light Emitting Diodes by Defective Hexagonal-Close-Packed Array," Advanced Functional Materials, vol. 22, 2012, pp. 3454-pp. 3459.

"Office Action of Taiwan Counterpart Application", issued on Apr. 18, 2016, p. 1-p. 8.

\* cited by examiner

ORGANIC LIGHT-EMITTING MODULE

TECHNICAL FIELD

The technical field relates to an organic light-emitting module.

BACKGROUND

An organic light-emitting diode (OLED) is a light-emitting device in which the emissive layer is a film of organic compound which emits light in response to an electric current. This layer of organic semiconductor is located between two electrodes. Generally, at least one of these electrodes is transparent.

OLEDs have been employed to produce digital displays in devices such as television screens, computer monitors, portable devices such as mobile phones, handheld game consoles and personal digital assistants (PDAs). Besides, a major area of research is the development of white OLED devices for use in solid-state lighting applications.

Generally, an OILED has high internal quantum efficiency. However, a large amount of light emitted from the emissive layer is confined inside the OLED. This is because a large amount of light is confined inside organic materials and a transparent substrate, which causes the external quantum efficiency of the OLED is about 20%. As a result, how to increase the external quantum efficiency is important for the development of the OLED.

SUMMARY

An exemplary embodiment of the disclosure provides an organic light-emitting module including a light-transmissive substrate, a light extracting structure, a first electrode, an organic light-emitting stack, a second electrode, and a transparent carrying board. The light-transmissive substrate has an index of refraction greater than 1.5 and has a first surface and a second surface opposite to the first surface. The light extracting structure is disposed at the first surface. The first electrode is disposed on the second surface of the light-transmissive substrate. The organic light-emitting stack is disposed on the first electrode. The second electrode is disposed on the organic light-emitting stack. The transparent carrying board is connected with the light extracting structure. A minimum distance between the light extracting structure and the transparent carrying board is less than or equal to 125 μm.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
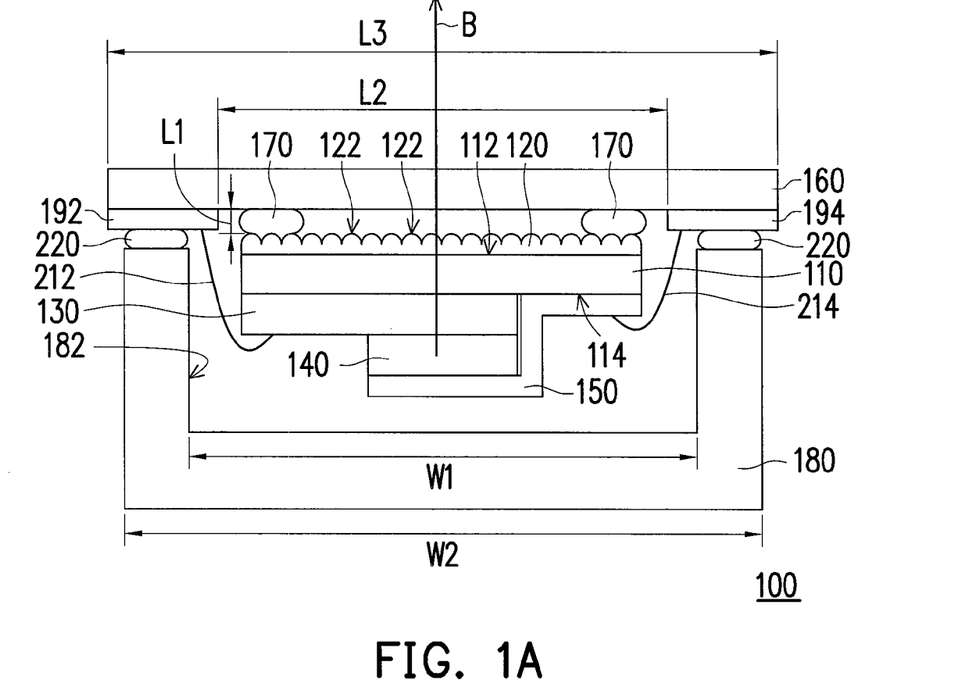
FIG. 1A is a schematic cross-sectional view of an organic light-emitting module according to an exemplary embodiment.
Figure 1B:
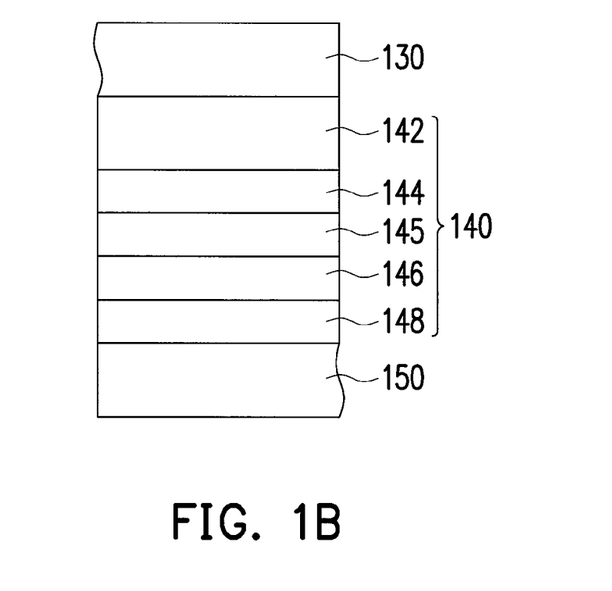
FIG. 1B is a schematic cross-sectional view showing the structures of the organic light-emitting stack in FIG. 1A.
Figure 1C:
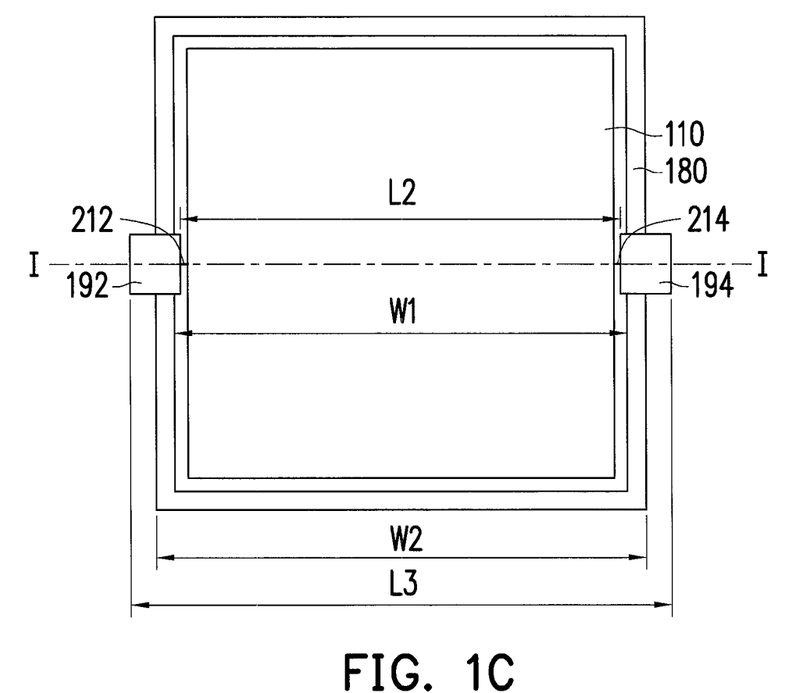
FIG. 1C is a schematic top view showing the position relationship of the light-transmissive substrate, the transparent cover board, the first conductive pad, and the second conductive pad in FIG. 1A.

FIG. 1A is a schematic cross-sectional view of an organic light-emitting module according to an exemplary embodiment, FIG. 1B is a schematic cross-sectional view showing the structures of the organic light-emitting stack in FIG. 1A, and FIG. 1C is a schematic top view showing the position relationship of the light-transmissive substrate, the transparent cover board, the first conductive pad, and the second conductive pad in FIG. 1A. Referring to FIGS. 1A to 1C, the organic light-emitting module 100 in this embodiment includes a light-transmissive substrate 110, a light extracting structure 120, a first electrode 130, an organic light-emitting stack 140, a second electrode 150, and a transparent carrying board 160. The light-transmissive substrate 110 has an index of refraction greater than 1.5. The light-transmissive substrate 110 may be a flexible substrate. In this embodiment, the light-transmissive substrate 110 is made of an organic material, for example, polyethylene naphthalate (PEN), which has an index of refraction of 1.76. However, in other embodiments, the light-transmissive substrate 110 may be a rigid substrate, for example, a glass substrate. Moreover, in this embodiment, the light-transmissive substrate 110 has a first surface 112 and a second surface 114 opposite to the first surface 112. The light extracting structure 120 is disposed at the first surface 112.

The light extracting structure 120 may include a plurality of surface micro-structures 122. In this embodiment, the surface micro-structures 122 are a plurality of micro-lenses arranged in an array. However, in other embodiments, the surface micro-structures 122 are a plurality of micro-prisms arranged in an array. In this embodiment, the light extracting structure 120 and the light transmissive substrate 110 are individually formed. For example, the light extracting structure 120 may be formed or stuck on the first surface 112 of the light-transmissive substrate 110. Alternatively, a transparent material may be coated on the first surface 112 and then imprinted to form the shape of the surface micro-structures 122. However, in other embodiments, the light extracting structure 120 is integrally formed with the light-transmissive substrate 110.

The first electrode 130 is disposed on the second surface 114 of the light-transmissive substrate 110. The organic light-emitting stack 140 is disposed on the first electrode 130, and the second electrode 150 is disposed on the organic light-emitting stack 140. The organic light-emitting stack 140 may include a hole injection layer 142, a hole transport layer 144, an emissive layer 145, an electron transport layer 146, and an electron injection layer 148 arranged in the sequence from the first electrode 130 to the second electrode 150, but the disclosure is not limited thereto. In some embodiments, the organic light-emitting stack 140 may not include at least one of the hole injection layer 142 and the electron injection layer 148. In this embodiment, the first electrode 130 is made of transparent conductive material, for example, indium tin oxide (ITO), while the second electrode 150 is made of metal. However, in some embodiments, both the first electrode 130 and the second electrode 150 are made of transparent conductive material.

The transparent carrying board 160 is connected with the light extracting structure 120. In this embodiment, the transparent carrying board 160 may be made of glass or any other appropriate transparent material. In this embodiment, the minimum distance L1 between the light extracting structure 120 and the transparent carrying board 160 is less than or equal to 125 μm. For example, the distance between the vertex of the light extracting structure 120 and the transparent carrying board 160 is less than or equal to 125 μm. In one embodiment, the minimum distance L1 is less than or equal to 30 μm. For instance, the minimum distance L1 is 25.4 μm. In this embodiment, the connection position of the light extracting structure 120 connected to the transparent carrying board 160 is within an area of the light extracting structure 120. In detail, the organic light-emitting module 100 further includes an adhesive element 170 connecting the edge of the light extracting structure 120 with the transparent carrying board 160. However, in some other embodiments, the organic light-emitting module 100 does not include the adhesive element 170, and the light extracting structure 120 is in direction contact with the transparent carrying board 160. Therefore, the minimum distance L1 is about or less than the thickness of the adhesive element 170. Since the adhesive element 170 is flexible, if the adhesive element 170 is too thick and thus fills the gaps among the surface micro-structures 122 to full, the light extracting efficiency of the light extracting structure 120 is reduced. This is because the refractive index of the adhesive element 170 is about the refractive index of the light extracting structure 120. Therefore, in this embodiment, the adhesive element 170 is thin, so that the minimum distance L1 between the light extracting structure 120 and the transparent carrying board 160 is less than or equal to 125 μm, e.g. less than or equal to which may achieve good light extracting efficiency. In an embodiment, the minimum distance L1 may be greater than 250 nm.

In this embodiment, the area of the adhesive element 170 covering the light extracting structure 120 is less than 10% of the area of the light extracting structure 120, and the transmittance of the adhesive element 170 is less than 50%. Alternatively, the adhesive element 170 may be made of a transparent adhesive having an index of refraction ranging from 1-2.

In this embodiment, the light B emitted from the organic light-emitting stack 140 passes through the first electrode 130, the light-transmissive substrate 110, the light extracting structure 120, and the transparent carrying board 160 in sequence so as to be transmitted to the outside. In the organic light-emitting module 100 according to this embodiment, the index of refraction of the light-transmissive substrate 110 is greater than 1.5, which matches the index of refraction of the first electrode 130 (the index of refraction of ITO is, for example, 1.9). As a result, the waveguide mode confining photons in the organic light-emitting stack 140 (whose index of refraction is about 1.75) and the first electrode 130 is reduced or removed. Moreover, since there is the light extracting structure 120 (having surface micro-structures) disposed on the first surface 112 of the light-transmissive substrate 110, the interface total reflection between the light-transmissive substrate 110 and air is reduced or removed. As a result, the brightness of the organic light-emitting module 100 is increased to 1.3 times. Therefore, the organic light-emitting module 100 may be an illumination module having high efficiency.

In this embodiment, the organic light-emitting module further includes a transparent cover board 180 connected to the transparent carrying board 160 and having a recess 182 containing the light-transmissive substrate 110, the light extracting structure 120, the first electrode 130, the organic light-emitting stack 140, and the second electrode 150. In this embodiment, the organic light-emitting module 100 further includes a first conductive pad 192 and a second conductive pad 194. The first conductive pad 192 is disposed on the transparent carrying board 160 and electrically connected to the first electrode 130, and the second conductive pad 194 is disposed on the transparent carrying board 160 and electrically connected to the second electrode 150. In at least one cross-section of the organic light-emitting module 100 (for example, the cross-section shown in FIG. 1A which is a cross-section along line I-I shown in FIG. 1C), the distance L2 between sides of the first conductive pad 192 and the second conductive pad 194 close to each other is less than the width W1 of the recess 182, and the distance L3 between sides of the first conductive pad 192 and the second conductive pad 194 away from each other is greater than the width W2 of the transparent cover board 180.

In this embodiment, the edge of the transparent cover board 180 is bonded to the transparent carrying board 160 through a connecting member 220, and the connecting member 220 is, for example, an adhesive.

In this embodiment, the organic light-emitting module 100 further includes a first conductive connecting element 212 and a second conductive connecting element 214. The first conductive connecting element 212 connects the first conductive pad 192 with the first electrode 130, and the second conductive connecting element 214 connects the second conductive pad 194 with the second electrode 150. In this embodiment, the first conductive connecting element 212 and the second conductive connecting element 214 are bonding wires. Since the distance L2 is less than the width W1, the bonding wires are easy to be connected to the first electrode 130 and the second electrode 150. Since the distance L3 is greater than the width W2, external circuits, for example, external conductive wires are easy to be connected to the first electrode 130 and the second electrode 150. In other embodiments, the first conductive connecting element 212 and the second conductive connecting element 214 may be conductive glue or conductive tapes.

Figure 2:
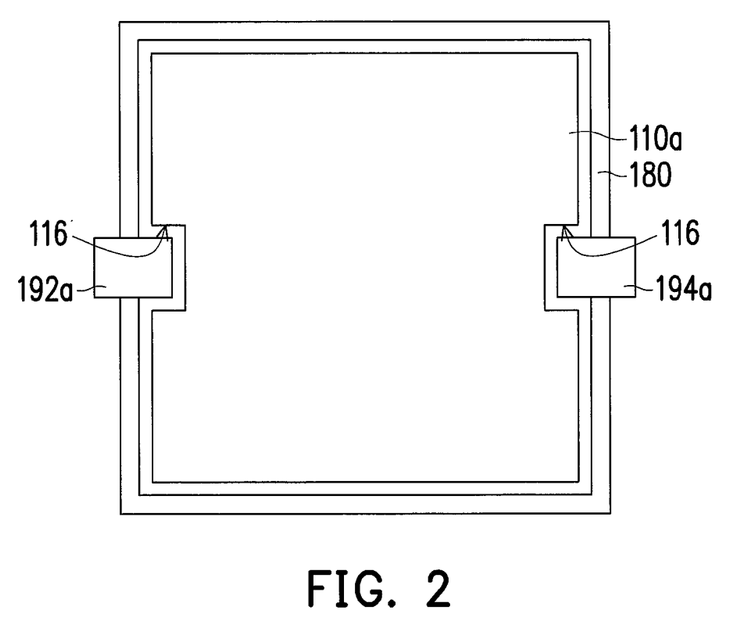
FIG. 2 is a schematic top view showing the position relationship of the light-transmissive substrate, the transparent cover board, the first conductive pad, and the second conductive pad of another variation of the structure shown in FIG. 1C.

FIG. 2 is a schematic top view showing the position relationship of the light-transmissive substrate, the transparent cover board, the first conductive pad, and the second conductive pad of another variation of the structure shown in FIG. 1C. Referring to FIG. 2, in this embodiment, the light-transmissive substrate 110a has indentations 116, and a part of the first conductive pad 192a and a part of the second conductive pad 194a extend into the indentations 116 so as to increase the bonding areas for the first conductive connecting element 212 and the second conductive connecting element 214.

Figure 3:
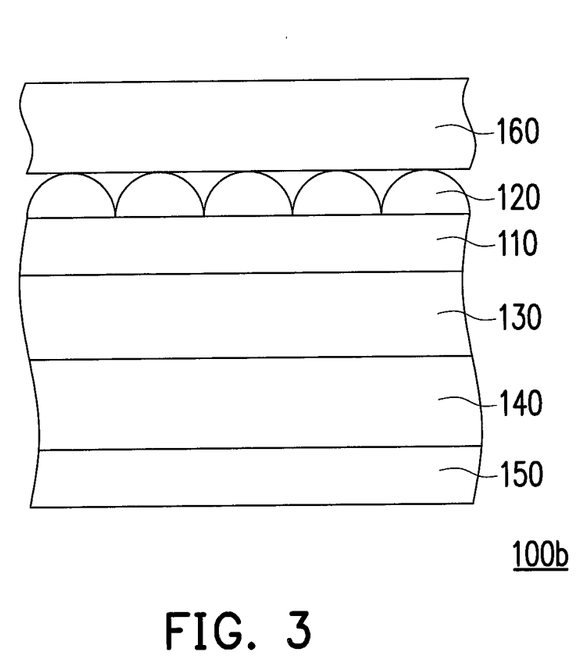
FIG. 3 is a schematic partial cross-sectional view of an organic light-emitting module according to another exemplary embodiment.

FIG. 3 is a schematic partial cross-sectional view of an organic light-emitting module according to another exemplary embodiment. Referring to FIG. 3, the organic light-emitting module 100b in this embodiment is similar to the organic light-emitting module 100 in FIG. 1A, and the main difference therebetween is as follows. In the organic light-emitting module 100b, the light extracting structure 120 is in direct contact with the transparent carrying board 160. The bonding force between the light extracting structure 120 and the transparent carrying board 160 may be van der Waals force or electrostatic force.

Figure 4:
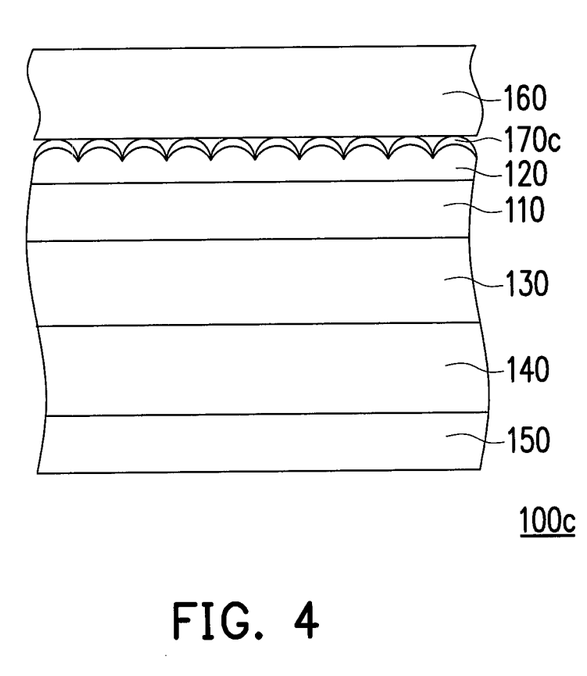
FIG. 4 is a schematic partial cross-sectional view of an organic light-emitting module according to another exemplary embodiment.

FIG. 4 is a schematic partial cross-sectional view of an organic light-emitting module according to another exemplary embodiment. Referring to FIG. 4, the organic light-emitting module 100c in this embodiment is similar to the organic light-emitting module 100 in FIG. 1A, and the main difference therebetween is as follows. In this embodiment, the organic light-emitting module 100c includes an adhesive film 170c to replace the adhesive element 170 in FIG. 1A. The adhesive film 170c connects the light extracting structure 120 with the transparent carrying board 160.

In this embodiment, the index of refraction of the adhesive film 170c ranges from 1 to 2. In an embodiment, the index of refraction of the adhesive film 170c is less than the index of refraction of the light-transmissive substrate 110. Moreover, in this embodiment, the area of the adhesive film 170c covering the light extracting structure 120 is greater than 90% of the area of the light extracting structure 120. Besides, the area of the adhesive film 170c may be less than or equal to the area of the light-transmissive substrate 110. In one embodiment, the adhesive film 170c completely cover the light extracting structure 120.

Figure 5:
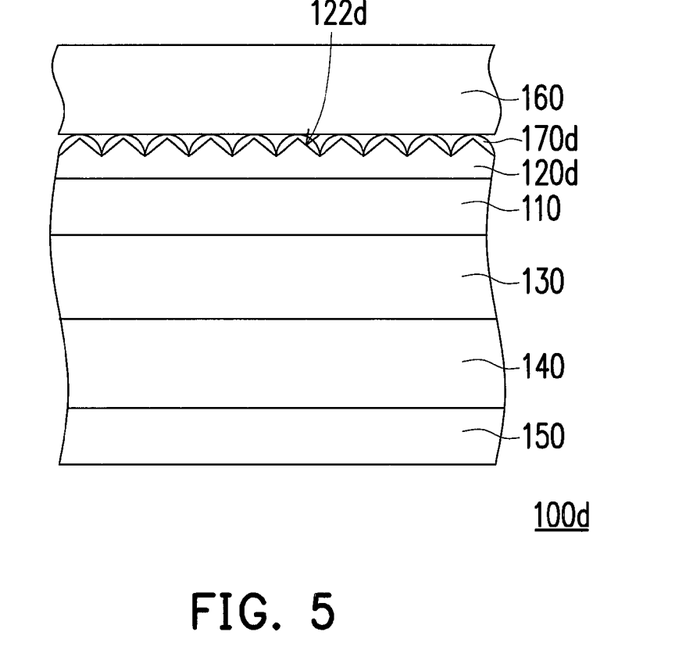
FIG. 5 is a schematic partial cross-sectional view of an organic light-emitting module according to another exemplary embodiment.

FIG. 5 is a schematic partial cross-sectional view of an organic light-emitting module according to another exemplary embodiment. Referring to FIG. 5, the organic light-emitting module 100d in this embodiment is similar to the organic light-emitting module 100c in FIG. 4, and the main difference therebetween is as follows. In the organic light-emitting module 100d, the surface micro-structures 122d of the light extracting structure 120d are micro-prisms arranged in an array, and the adhesive film 170d connects the light extracting structure 120d with the transparent carrying board 160.

Figure 6:
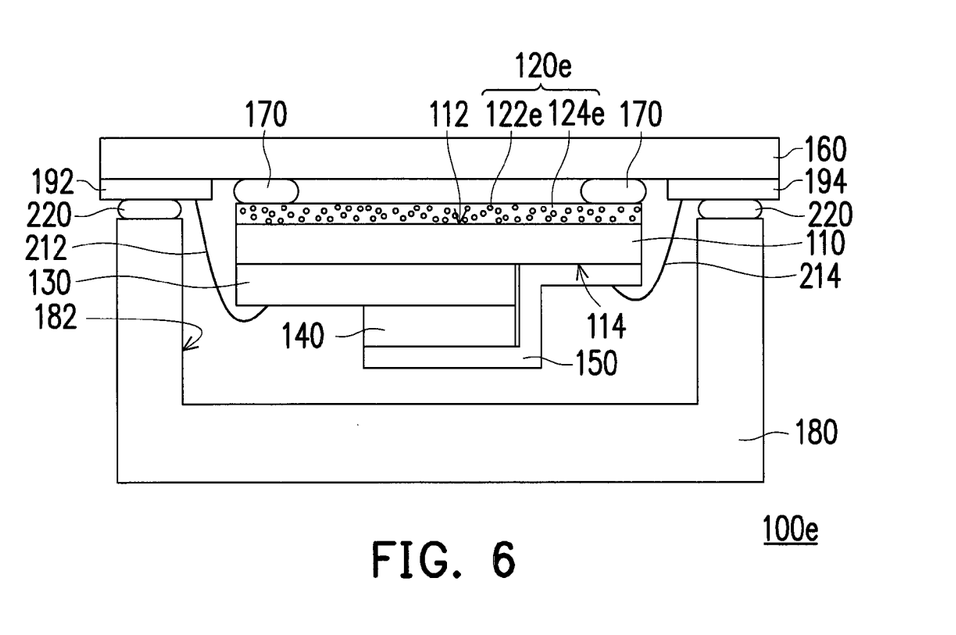
FIG. 6 is a schematic cross-sectional view of an organic light-emitting module according to another exemplary embodiment.

FIG. 6 is a schematic cross-sectional view of an organic light-emitting module according to another exemplary embodiment. Referring to FIG. 6, the organic light-emitting module 100e in this embodiment is similar to the organic light-emitting module 100 in FIG. 1A, and the main difference therebetween is as follows. In the organic light-emitting module 100e, the light extracting structure 120e is a diffuser film. The diffuser film may have a matrix 124e and a plurality of scattering particles 122e distributed in the matrix 124e. Moreover, the adhesive element 170 connects the edge of the light extracting structure 120e with the transparent carrying board 160.

Figure 7:
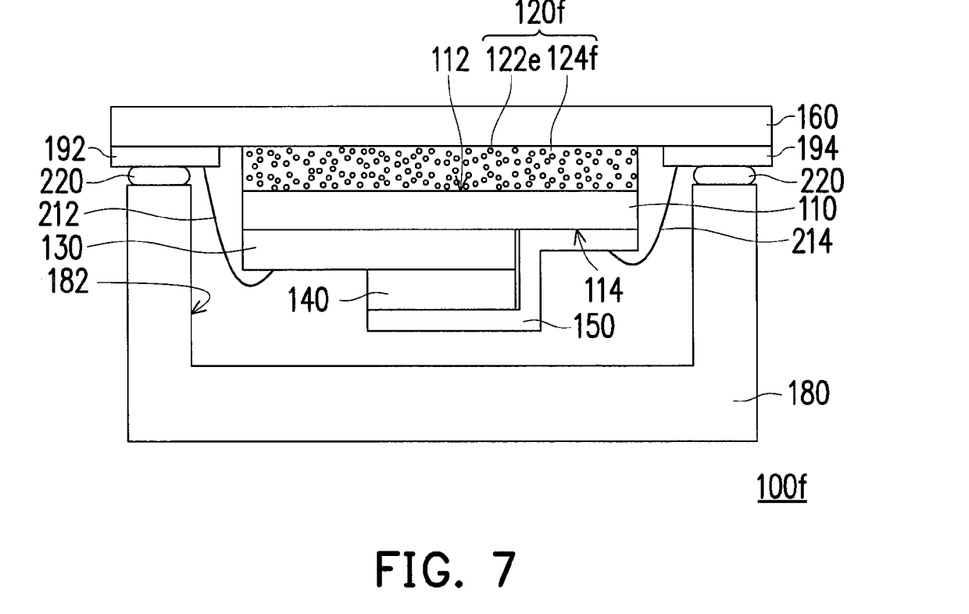
FIG. 7 is a schematic cross-sectional view of an organic light-emitting module according to another exemplary embodiment.

FIG. 7 is a schematic cross-sectional view of an organic light-emitting module according to another exemplary embodiment. Referring to FIG. 7, the organic light-emitting module 100f in this embodiment is similar to the organic light-emitting module 100e in FIG. 6, and the main difference therebetween is as follows. In the organic light-emitting module 100f, the light extracting structure 120f is in direct contact with the transparent carrying board 160. In detail, the light extracting structure 120f is a diffuser film having a matrix 124f and the scattering particles 122e distributed in the matrix 124f. The matrix 124f is made of adhesive material, so that the matrix 124f can bond the light-transmissive substrate 110 with the transparent carrying board 160.

Figure 8:
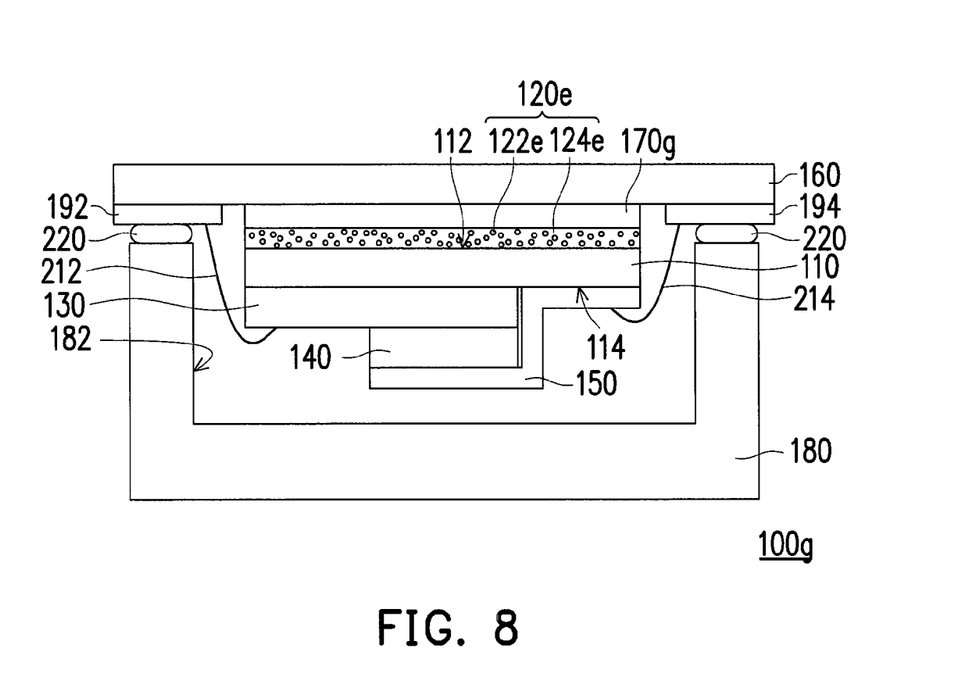
FIG. 8 is a schematic cross-sectional view of an organic light-emitting module according to another exemplary embodiment.

FIG. 8 is a schematic cross-sectional view of an organic light-emitting module according to another exemplary embodiment. Referring to FIG. 8, the organic light-emitting module 100g in this embodiment is similar to the organic light-emitting module 100c in FIG. 4, and the main difference therebetween is as follows. In the organic light-emitting module 100g, the light extracting structure 120e is the diffuser film shown in FIG. 6, and the adhesive film 170g similar to the adhesive film 170c shown in FIG. 4 connects the light extracting structure 120e with the transparent carrying board 160.

In this embodiment, the index of refraction of the adhesive film 170g ranges from 1 to 2. In an embodiment, the index of refraction of the adhesive film 170g is less than the index of refraction of the light-transmissive substrate 110. Moreover, in this embodiment, the area of the adhesive film 170g covering the light extracting structure 120 is greater than 90% of the area of the light extracting structure 120. Besides, the area of the adhesive film 170g may be less than or equal to the area of the light transmissive substrate 110. In one embodiment, the adhesive film 170g completely cover the light extracting structure 120.

Figure 9:
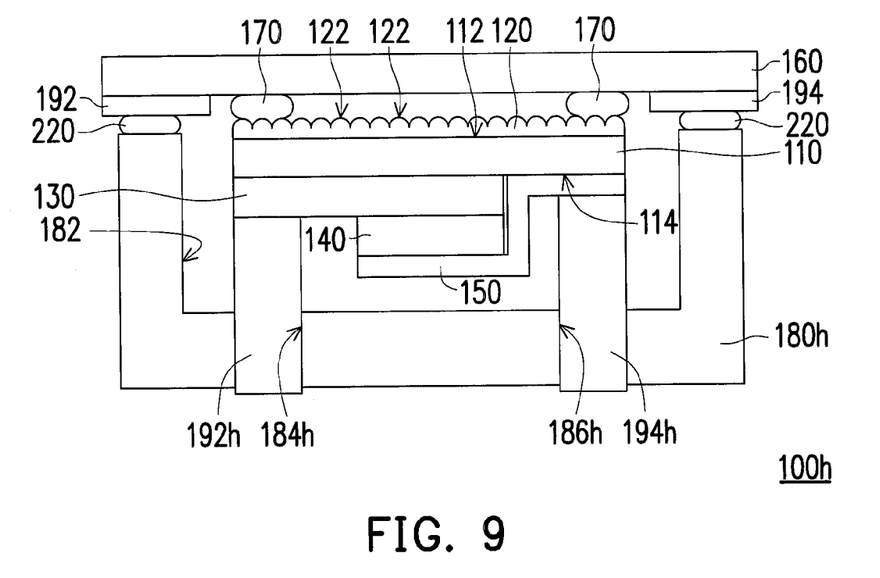
FIG. 9 is a schematic cross-sectional view of an organic light-emitting module according to another exemplary embodiment.

FIG. 9 is a schematic cross-sectional view of an organic light-emitting module according to another exemplary embodiment. Referring to FIG. 9, the organic light-emitting module 100h in this embodiment is similar to the organic light-emitting module 100 in FIG. 1A, and the main difference therebetween is as follows. In the organic light-emitting module 100h according to this embodiment, at least one first conductive pad 192h (one first conductive pad 192h is exemplarily shown in FIG. 9) is electrically connected to the first electrode 130 and penetrates the transparent cover board 180h through at least one first through hole 184h (one first through hole 184h is exemplarily shown in FIG. 9). At least one second conductive pad 194h (one second conductive pad 194h is exemplarily shown in FIG. 9) is electrically connected to the second electrode 150 and penetrates the transparent cover board 180h through at least one second through hole 186h (one second through hole 186h is exemplarily shown in FIG. 9). Therefore, external circuits, for example external wires, may be connected to the first conductive pad 192h and the second conductive pad 194h.

Figure 10:
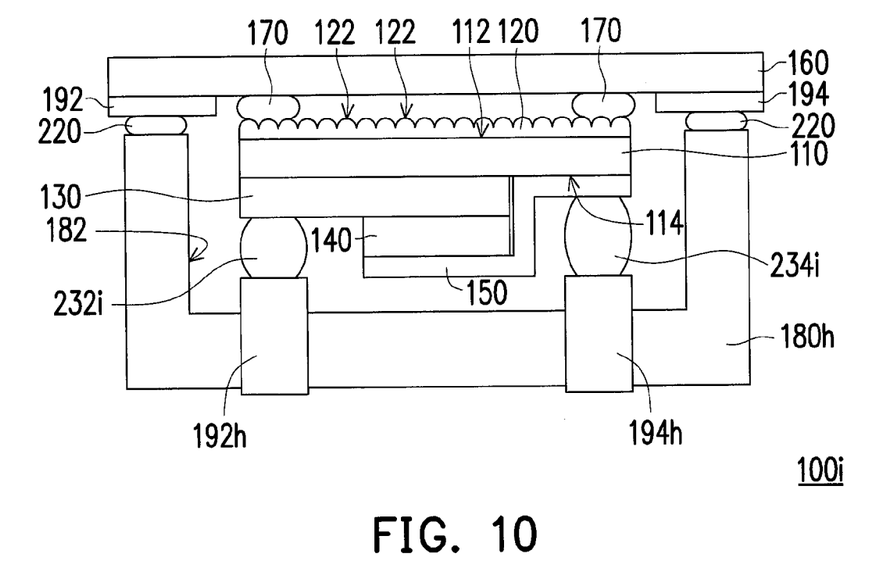
FIG. 10 is a schematic cross-sectional view of an organic light-emitting module according to another exemplary embodiment.

FIG. 10 is a schematic cross-sectional view of an organic light-emitting module according to another exemplary embodiment. Referring to FIG. 10, the organic light-emitting module 100*i* in this embodiment is similar to the organic light-emitting module 100*h* in FIG. 9, and the main difference therebetween is as follows. In this embodiment, the organic light-emitting module 100*i* further includes at least one first conductive connecting element 232*i* (one first conductive connecting element 232*i* is exemplarily shown in FIG. 10) and at least one second conductive connecting element 234*i* (one second conductive connecting element 234*i* is exemplarily shown in FIG. 10). The first conductive connecting element 232*i* connects the first conductive pad 192*h* with the first electrode 130, and the second conductive connecting element 234*i* connects the second conductive pad 194*h* with the second electrode 150. In this embodiment, the first conductive connecting element 232*i* and the second conductive connecting element 234*i* are conductive bumps (for example, indium bumps or any other bumps suitable for low temperature bonding processes), or anisotropic conductive films (ACFs).

Figure 11A:
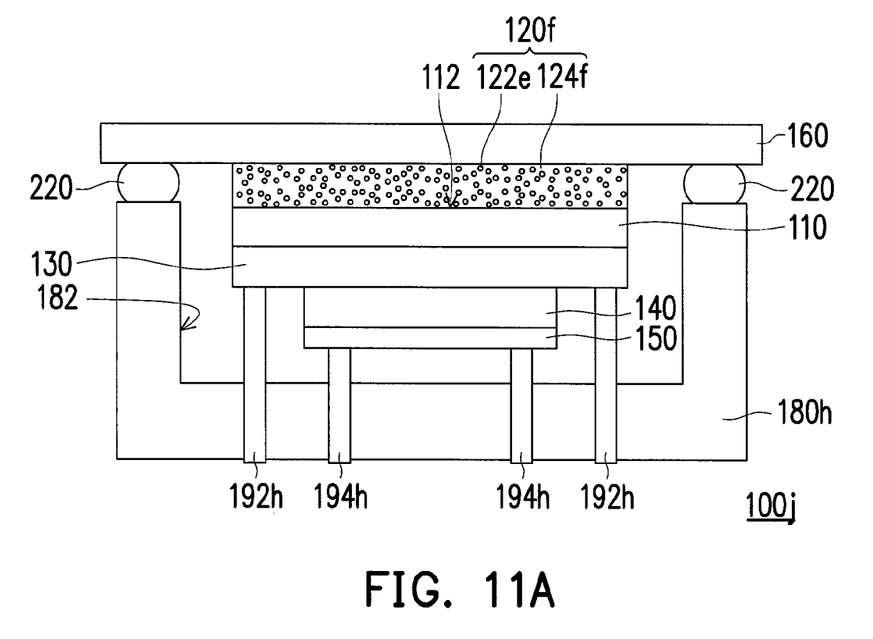
FIG. 11A is a schematic cross-sectional view of an organic light-emitting module according to another exemplary embodiment.
Figure 11B:
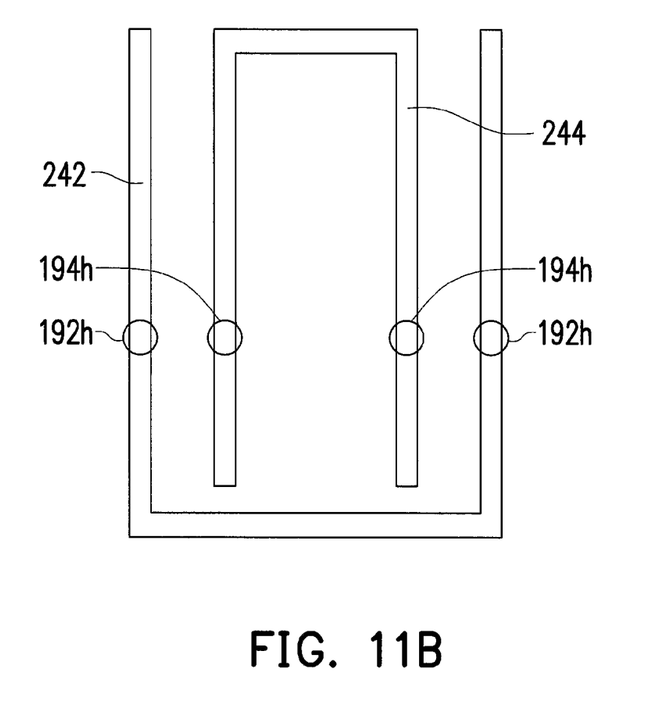
FIG. 11B is the schematic bottom view of conductive extensions of the organic light-emitting module in FIG. 11A.

FIG. 11A is a schematic cross-sectional view of an organic light-emitting module according to another exemplary embodiment, and FIG. 11B is the schematic bottom view of conductive extensions of the organic light-emitting module in FIG. 11A. Referring to FIGS. 11A and 11B, the organic light-emitting module 100*j* in this embodiment is similar to the organic light-emitting module 100*h* in FIG. 9, and the main difference is as follows. In the organic light-emitting module 100*j*, there are a plurality of first conductive pads 192*h* and a plurality of second conductive pads 194*h*. In this embodiment, a conductive extension 242 connects the first conductive pads 192*h*, and a conductive extension 244 connects the second conductive pads 194*h*.

The plurality of first conductive pads 192*h* and the plurality of second conductive pads 194*h* make the current distribution in the organic light-emitting stack 140 more dispersive or uniform. In this embodiment, the conductive extension 242 is formed on the first electrode 130, and the conductive extension 244 is formed on the second electrode 150, so that the dispersion or uniformity of the current distribution in the organic light-emitting stack 140 is further enhanced. In some other embodiments, the conductive extensions 242 and 244 may be disposed on an external circuit board, e.g. a printed circuit board, to which the first conductive pads 192*h* and the second conductive pads 194*h* are bonded.

Figure 12:
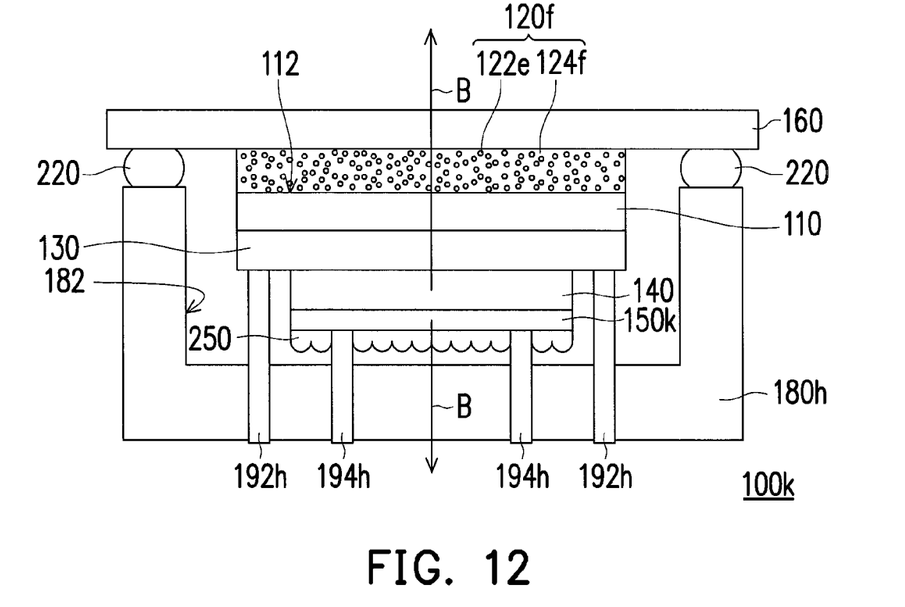
FIG. 12 is a schematic cross-sectional view of an organic light-emitting module according to another exemplary embodiment.

FIG. 12 is a schematic cross-sectional view of an organic light-emitting module according to another exemplary embodiment. Referring to FIG. 12, the organic light-emitting module 100*k* in this embodiment is similar to the organic light-emitting module 100*j* in FIG. 11A, and the main difference is as follows. In this embodiment, the organic light-emitting module 100*k* further includes another light extracting structure 250 disposed on the second electrode 150. Moreover, the second electrode 150*k* is made of transparent conductive material, e.g., indium tin oxide. As a result, a part of the light B passes through the first electrode 130, the light-transmissive substrate 110, the light extracting structure 120*f*, and the transparent carrying board 160 in sequence so as to be transmitted to the outside, and another part of the light B passes through the second electrode 150*k*, the light extracting structure 250, and the transparent cover board 180*h* in sequence so as to be transmitted to the outside.

Figure 13A:
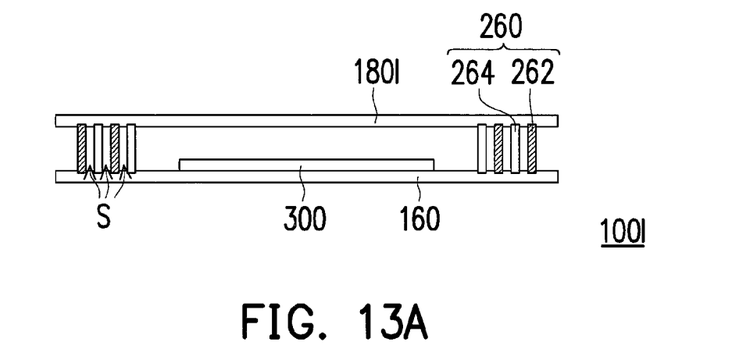
FIG. 13A is a schematic cross-section view of an organic light-emitting module according to another exemplary embodiment in an unbent state.
Figure 13B:
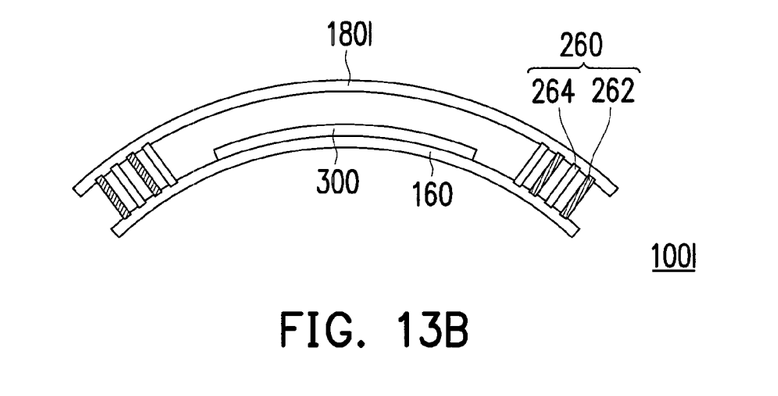
FIG. 13B is a schematic cross-section view of the organic light-emitting module as shown in FIG. 13A in a bent state.

FIG. 13A is a schematic cross-section view of an organic light-emitting module according to another exemplary embodiment in an unbent state, and FIG. 13B is a schematic cross-section view of the organic light-emitting module as shown in FIG. 13A in a bent state. Referring to FIGS. 13A and 13B, the organic light-emitting module 1001 is similar to the organic light-emitting module 100 shown in FIG. 1A, and the main difference is as follows. In the organic light-emitting module 1001, the transparent cover board 1801 does not have the recess 182 shown in FIG. 1A. However, in some other embodiments, the transparent cover board 1801 may have the recess 182 as shown in FIG. 1A. Moreover, in this embodiment, the organic light-emitting module 1001 further includes a plurality of connecting members 260 connecting the edge of the transparent carrying board 160 and the edge of the transparent cover board 1801. The device 300 represents the light-transmissive substrate 110, the light extracting structure 120 (or 120*d*, 120*e*, or 120*f*), the first electrode 130, the organic light-emitting stack 140, and the second electrode 150 (or further includes the adhesive element 170 or the adhesive film 170*c* or 170*d*). The device 300 is disposed between the transparent carrying board 160 and the transparent cover board 1801. A space S is between every two adjacent connecting members 260. Since there are spaces S among the connecting members 260, the connecting members 264 have space to deform. Therefore, the connecting members 260 in this embodiment may reliably seal the space between the transparent carrying board 160 and the transparent cover board 1801.

In this embodiment, a part of the connecting members 260 includes at least one barrier member 262 (a plurality of barrier members 262 are exemplarily shown in FIGS. 13A and 13B), and the other part of the connecting members 260 includes at least one elastic member 264 (a plurality of elastic member 264 are exemplarily shown in FIGS. 13A and 13B). The barrier members 262 and the elastic members 264 are alternately disposed from the edge of the transparent cover board 1801 towards the center of the transparent cover board 1801. The barrier member 262 may block water, vapor, and air so as to reduce the oxidation of the elastic members 264. Moreover, in this embodiment, the transparent carrying board 160 and the transparent cover board 1801 are flexible, and the elasticity of the elastic members 264 may reduce the break of the connecting members 260. Since there are spaces S among the connecting members 260, the elastic members 264 have space to deform.

In conclusion, in the organic light-emitting module according to the exemplary embodiments, the index of refraction of the light-transmissive substrate is greater than 1.5, which matches the index of refraction of the first electrode. As a result, the waveguide mode confining photons in the organic light-emitting stack and the first electrode is reduced or removed. Moreover, since there is the light extracting structure disposed on the first surface of the light-transmissive substrate, the interface total reflection between the light-transmissive substrate and air is reduced or removed. Therefore, the organic light-emitting module may be an illumination module having high efficiency. Moreover, since there are spaces among the connecting members, the connecting members have space to deform. Therefore, the connecting members may reliably seal the space between the transparent carrying board and the transparent cover board.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An organic light-emitting module comprising:
   a light-transmissive substrate having an index of refraction greater than 1.5 and having a first surface and a second surface opposite to the first surface;
   a light extracting structure disposed at the first surface;
   a first electrode disposed on the second surface of the light-transmissive substrate;
   an organic light-emitting stack disposed on the first electrode;
   a second electrode disposed on the organic light-emitting stack;
   a transparent carrying board connected with the light extracting structure, wherein a minimum distance between the light extracting structure and the transparent carrying board is less than or equal to 125 µm; and
   a transparent cover board connected to the transparent carrying board and having a recess containing the light-transmissive substrate, the light extracting structure, the first electrode, the organic light-emitting stack, and the second electrode.

2. The organic light-emitting module according to claim 1, wherein a connection position of the light extracting structure connected to the transparent carrying board is within an area of the light extracting structure.

3. The organic light-emitting module according to claim 1, wherein the light extracting structure comprising a plurality of surface micro-structures.

4. The organic light-emitting module according to claim 3, wherein the surface micro-structures are a plurality of micro-lenses or micro-prisms arranged in an array.

5. The organic light-emitting module according to claim 1, wherein the light extracting structure is integrally formed with the light-transmissive substrate.

6. The organic light-emitting module according to claim 1, wherein the minimum distance between the light extracting structure and the transparent carrying board is less than or equal to 30 µm.

7. The organic light-emitting module according to claim 1, wherein the light extracting structure is a diffuser film.

8. The organic light-emitting module according to claim 1 further comprising:
   at least one first conductive pad electrically connected to the first electrode and penetrating the transparent cover board through at least one first through hole; and
   at least one second conductive pad electrically connected to the second electrode and penetrating the transparent cover board through at least one second through hole.

9. The organic light-emitting module according to claim 8 further comprising:
   at least one first conductive connecting element that connects the at least one first conductive pad with the first electrode; and
   at least one second conductive connecting element that connects the at least one second conductive pad with the second electrode.

10. The organic light-emitting module according to claim 1 further comprising:
    a first conductive pad disposed on the transparent carrying board and electrically connected to the first electrode; and
    a second conductive pad disposed on the transparent carrying board and electrically connected to the second electrode, wherein in at least one cross-section of the organic light-emitting module, a distance between sides of the first conductive pad and the second conductive pad close to each other is less than a width of the recess, and a distance between sides of the first conductive pad and the second conductive pad away from each other is greater than a width of the transparent cover board.

11. The organic light-emitting module according to claim 1 further comprising an adhesive film connecting the light extracting structure with the transparent carrying board.

12. The organic light-emitting module according to claim 11, wherein an index of refraction of the adhesive film is less than the index of refraction of the light-transmissive substrate.

13. The organic light-emitting module according to claim 11, wherein an index of refraction of the adhesive film ranges from 1 to 2.

14. The organic light-emitting module according to claim 11, wherein an area of the adhesive film covering the light extracting structure is greater than 90% of an area of the light extracting structure.

15. The organic light-emitting module according to claim 11, wherein an area of the adhesive film is less than or equal to an area of the light transmissive substrate.

16. The organic light-emitting module according to claim 1 further comprising an adhesive element connecting an edge of the light extracting structure with the transparent carrying board.

17. The organic light-emitting module according to claim 16, wherein an area of the adhesive element covering the light extracting structure is less than 10% of an area of the light extracting structure.

18. The organic light-emitting module according to claim 17, wherein the transmittance of the adhesive element is less than 50%.

19. The organic light-emitting module according to claim 1, wherein the light extracting structure is in direct contact with the transparent carrying board.

20. The organic light-emitting module according to claim 1 further comprising:
    a plurality of connecting members connecting an edge of the transparent carrying board and an edge of the transparent cover board, wherein a space is between every two adjacent connecting members, and wherein the light-transmissive substrate, the light extracting structure, the first electrode, the organic light-emitting stack, and the second electrode are disposed between the transparent carrying board and the transparent cover board.

21. The organic light-emitting module according to claim 20, wherein a part of the connecting members comprises at least one barrier member, the other part of the connecting members comprises at least one elastic member, and the at least one barrier member and the at least one elastic member are alternately disposed from the edge of the transparent cover board towards a center of the transparent cover board.

22. The organic light-emitting module according to claim 1 further comprising another light extracting structure disposed on the second electrode.

* * * * *